United States Patent
Flugan

(10) Patent No.: US 6,208,153 B1
(45) Date of Patent: Mar. 27, 2001

(54) SYSTEM FOR FAST PIEZOELECTRIC-RESONATOR PARAMETER MEASUREMENTS

(75) Inventor: David Flugan, Solon, OH (US)

(73) Assignee: Transat Corporation, Solon, OH (US)

( * ) Notice: Subject to any disclaimer, the term of this patent is extended or adjusted under 35 U.S.C. 154(b) by 0 days.

(21) Appl. No.: 09/372,263

(22) Filed: Aug. 11, 1999

(51) Int. Cl.⁷ .......................... G01R 29/22; G01R 27/26; G01V 3/00
(52) U.S. Cl. .......................... 324/727; 324/234; 324/318; 324/684
(58) Field of Search ........................ 324/727, 318, 324/684, 234; 702/65; 73/24.03

(56) References Cited

U.S. PATENT DOCUMENTS

| | | | |
|---|---|---|---|
| 3,840,804 | * 10/1974 | Sauerland | 324/727 |
| 3,916,303 | * 10/1975 | Butuzou et al. | 324/727 |
| 4,250,894 | * 2/1981 | Frei et al. | 600/587 |
| 4,384,229 | * 5/1983 | Inoue et al. | 310/315 |
| 4,447,782 | * 5/1984 | Ritkoski | 324/727 |
| 4,448,067 | * 5/1984 | Engelbrecht et al. | 73/119 A |
| 5,117,192 | * 12/1998 | Hurd | 324/727 |
| 5,444,641 | * 8/1995 | White | 702/65 |
| 5,705,879 | * 1/1998 | Abe et al. | 310/359 |
| 5,852,229 | * 12/1998 | Josse et al. | 73/24.06 |

* cited by examiner

Primary Examiner—Safet Metjahic
Assistant Examiner—Wasseem H. Hamdan

(57) ABSTRACT

Method and apparatus are described for speeding parameter measurements of piezoelectric-resonators. A large driving voltage is applied to the resonator until the resonator current reaches its desired steady-state value. Then the driving voltage is reduced to a level which will maintain that desired current level. This procedure allows the resonator to reach its steady state conditions faster than if a constant drive voltage were used.

6 Claims, 6 Drawing Sheets

SYSTEM FOR FAST PIEZOELECTRIC-RESONATOR PARAMETER MEASUREMENTS

BACKGROUND OF THE INVENTION

The main methods for measuring the electrical parameters of piezoelectric resonators are sometimes classified in two categories, "active" and "passive".

Active methods are based on oscillator circuits in which the resonator is the frequency determining element, and where a voltage and current at the resonance frequency build up across and through the resonator, starting at near-zero amplitude and building up during a transition phase to a steady-state value by means of amplification in a feedback loop.

Passive methods are based on applying a constant-amplitude voltage of predetermined frequency across the resonator, causing the resonator current to rise from a near-zero value during a transition time to a steady-state value.

Active methods are fast but inaccurate. For accurate parameter measurements, passive methods are commonly used. Of these there are several types, such as transmission, reflection, and S-parameter methods. They employ a variable-frequency RF voltage generator and a vector voltmeter to measure the resonator impedance at several frequencies by applying a constant-amplitude voltage at a frequency at or near resonance and making at least one more similar measurement at another near-by frequency and another measurement at a frequency far removed from resonance. The resonator parameters can then be calculated from these measurements. The methods have been internationally standardized, as described in "Publication 444", published by the International Electrotechnical Commission.

FIG. 1 is adapted from IEC Publication 444-5 page 59 figure A4. It shows a transmission measurement circuit. A network analyzer 1 includes an RF voltage generator with an output at its terminal C and a vector voltmeter with two inputs at terminals A and B. Terminal C is connected to a power splitter 3, which divides the power into two paths. One path is connected to a resonator 2 via a "Pi Network", a resistive network used to match the resonator impedance to that of its external connections. The output terminal of the pi network is connected to the B input of the vector voltmeter. The other path is connected to input A of the vector voltmeter via an attenuator 5. The vector voltmeter measures the amplitude of each input and the phase of the B input relative to the A input.

FIG. 2 shows a simplified circuit that is similar to that of FIG. 1. As in FIG. 1, an RF generator 4 is again connected to two paths: one to a resonator 2 and the other to input A of a vector voltmeter 7. The pi network is replaced by a resistor 8 and the internal impedance of generator 4. Current through the resonator produces a voltage across resistor 8 that is proportional to and representative of the current. That voltage is increased by amplifier 10 and applied to input B of the vector voltmeter. The circuit of FIG. 2 will be used to show how the invention can be incorporated into a transmission measurement system. A parameter evaluation can take several forms, but it requires at least three measurements. A common approach is to make measurements at two different frequencies at or near resonance, and a third measurement at an off-resonance frequency. All prior-art systems for parameter measurements apply a constant, steady-state voltage to the resonator.

The disadvantage of passive measurements is that they take longer than oscillator measurements. When the constant voltage is applied to the resonator, the resonator current builds up gradually until it reaches a constant steady-state value at which the measurement can be taken. The delay time depends on the resonator parameters and increases with decreasing resonator frequency. For example, for a crystal with a quality factor Q=100,000, a resistance of 10 Kohm, and a frequency of 32 kHz, the delay time is approximately 7 seconds. Since the parameter evaluation requires at least three measurements at different frequencies, the conventional method is quite time consuming.

The present application describes means for significantly reducing the measurement delay.

SUMMARY OF THE INVENTION

The invention relates to the measurement of the electrical parameters of piezoelectric resonators, especially quartz crystals. With increasing need for accuracy, most measurements have changed from the earlier "active" (oscillator-based) methods to the more accurate "passive" (external generator-based) methods. However, oscillator methods still prevail in the measurement of lower-frequency crystals, such as watch and clock crystals, which operate at frequencies around 32 KHZ. At these low frequencies, conventional passive measurements are slow because the resonator's transient- response time to an applied test voltage is proportional to Q/Fo, where Fo is the resonance frequency and Q the quality factor. A single passive parameter measurement at 32 KHZ may take half a minute, i.e. it is too time consuming for efficient mass production purposes. This is where the present invention provides a solution: an accurate passive method made at speeds comparable to that of active methods.

BRIEF DESCRIPTION OF THE DRAWINGS

The invention may take various forms. The drawings are only for purposes of illustrating a preferred embodiment and are not to be construed as limiting the invention.

PREFERRED EMBODIMENTS

The invention relates to speeding up passive measurements of resonator parameters. It is applicable to passive methods such as transmission, reflection, and S-parameter measurements, and it will be explained in detail by describing its application to the transmission method.

Figure 3:
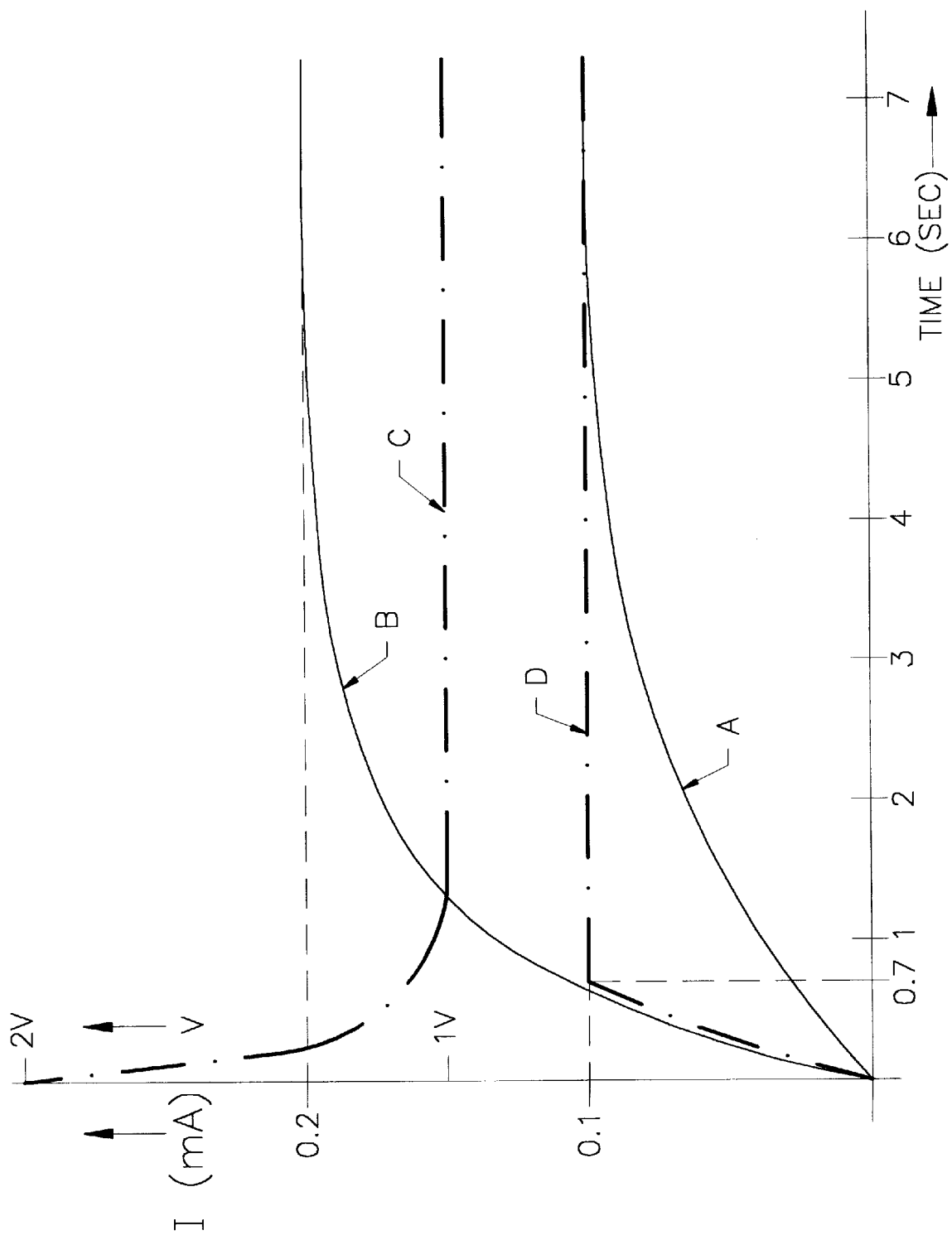
FIG. 3 shows the transient response of the current through a resonator after different-amplitude voltages are applied across the resonator.

A piezoelectric resonator's electrical parameters of main interest are the resistance R, inductance L, and capacitance C of a series resonant circuit that is shunted by a capacitance Co. In the vicinity of resonance, the resonator can be modeled as a series R L C circuit, with a series resonance frequency $Fo=1/(2*pi*Squareroot(LC))$ and a quality factor $Q=2*pi*L/R$. When a constant-amplitude RF voltage V of frequency Fo is applied across a resonator with resistance R, it generates a steady-state resonator current Iss of $I=Iss=V/R$ However, the current does not instantly reach its steady state value but builds up gradually according to $I=(1-exp(-t*Fo*pi/Q))*Iss$ For example, curve A in FIG. 3 shows the resonator current vs time in response to a constant voltage of amplitude 1 Volt. The resonator has a frequency Fo=32 Khz, Q=100,000, and R=10 Kohm. The current starts at zero and builds up gradually until it reaches 99.9% of its steady-state amplitude after a delay of about 7 seconds. Note that the time delay is proportional to the ratio Q/Fo Curve A is prior art.

If the resonator is driven by twice the voltage, 2 Volts, the current builds up during the same delay time to twice the steady-state amplitude, I=2×Iss, as shown in curve B (also prior art) of FIG. 3, but it reaches the value I=Iss after only about 0.7 seconds, or about 10 times faster than before. Even greater speed increase is possible by driving the resonator with an even higher initial voltage. This suggests a method to speed the transient settling time of a crystal:

- At the start, drive the crystal with more than the (final) measurement voltage.
- As the current reaches its desired final value, reduce the driving voltage to the (final) level required to maintain a desired steady-state current.

Curves C and D of FIG. 3 show voltage and current, respectively, for this method. They are based on the assumption that a desired steady-state current of V/R=0.1 mA needs to be reached in t=0.7 sec. The voltage per curve C starts at a value higher than 1 V and then decreases toward a steady-state value of 1 V. In response to that voltage, the current per curve D starts at zero and increases toward a steady-state value of 0.1 mA, which it reaches after a time of 0.7 sec, i.e. ten times faster than in the prior-art approach per curve A.

Figure 1:
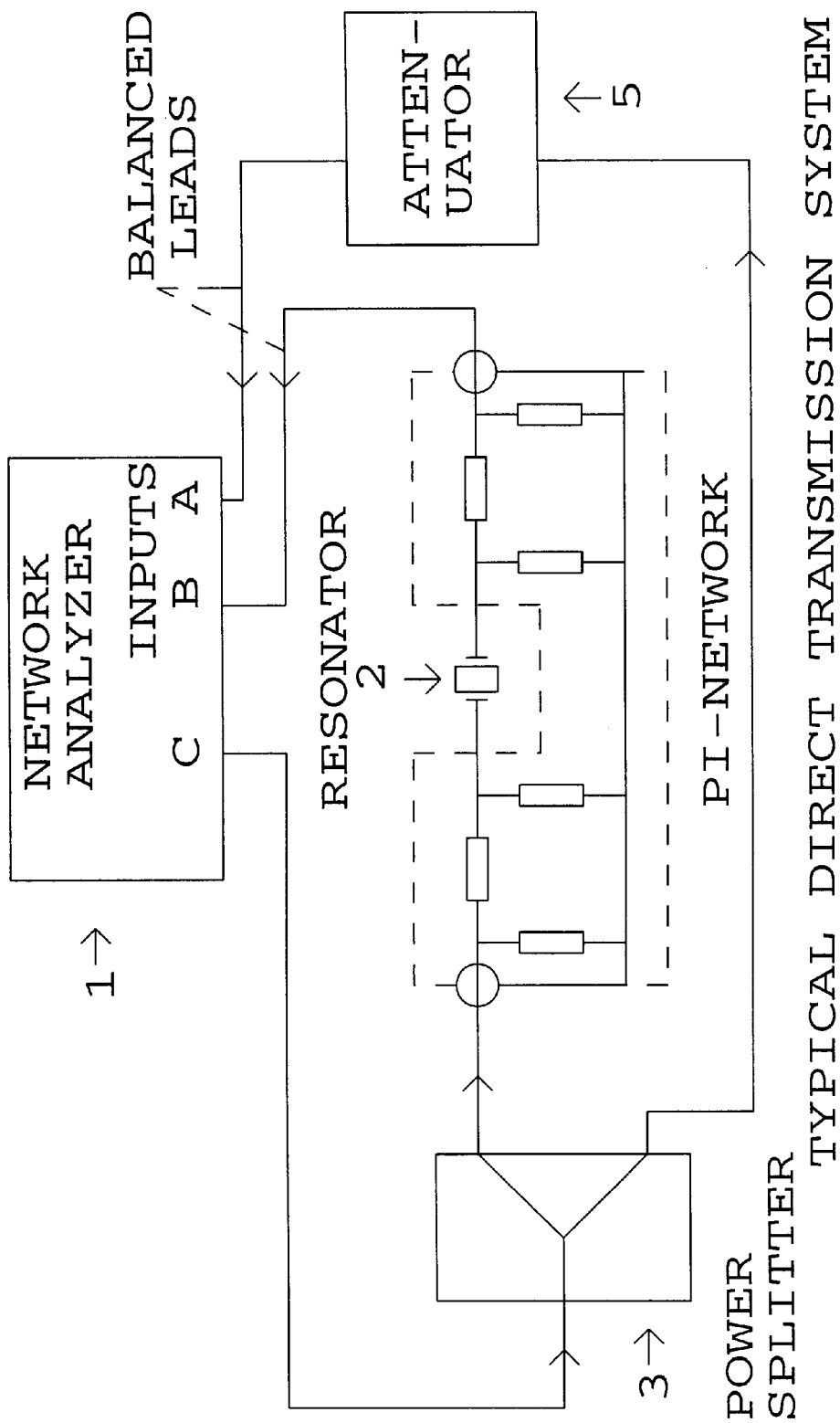
FIG. 1 shows a prior-art crystal transmission measurement system.
Figure 2:
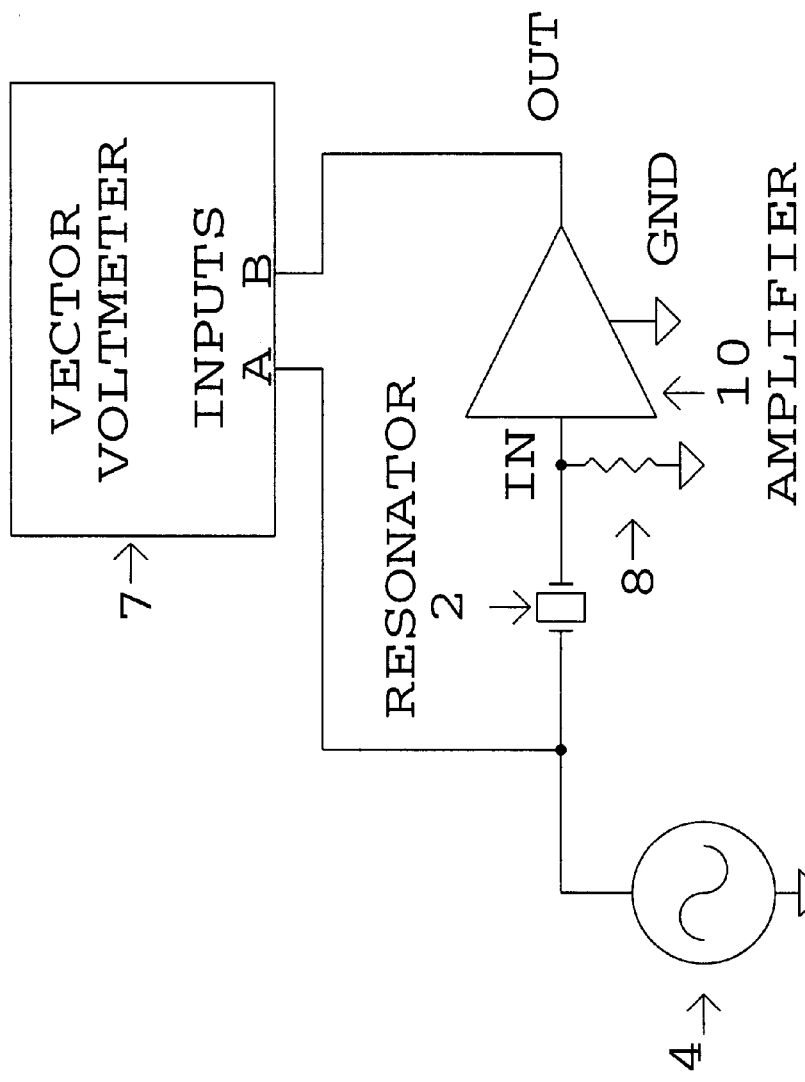
FIG. 2 shows a simplified version of prior-art FIG. 1.
Figure 4:
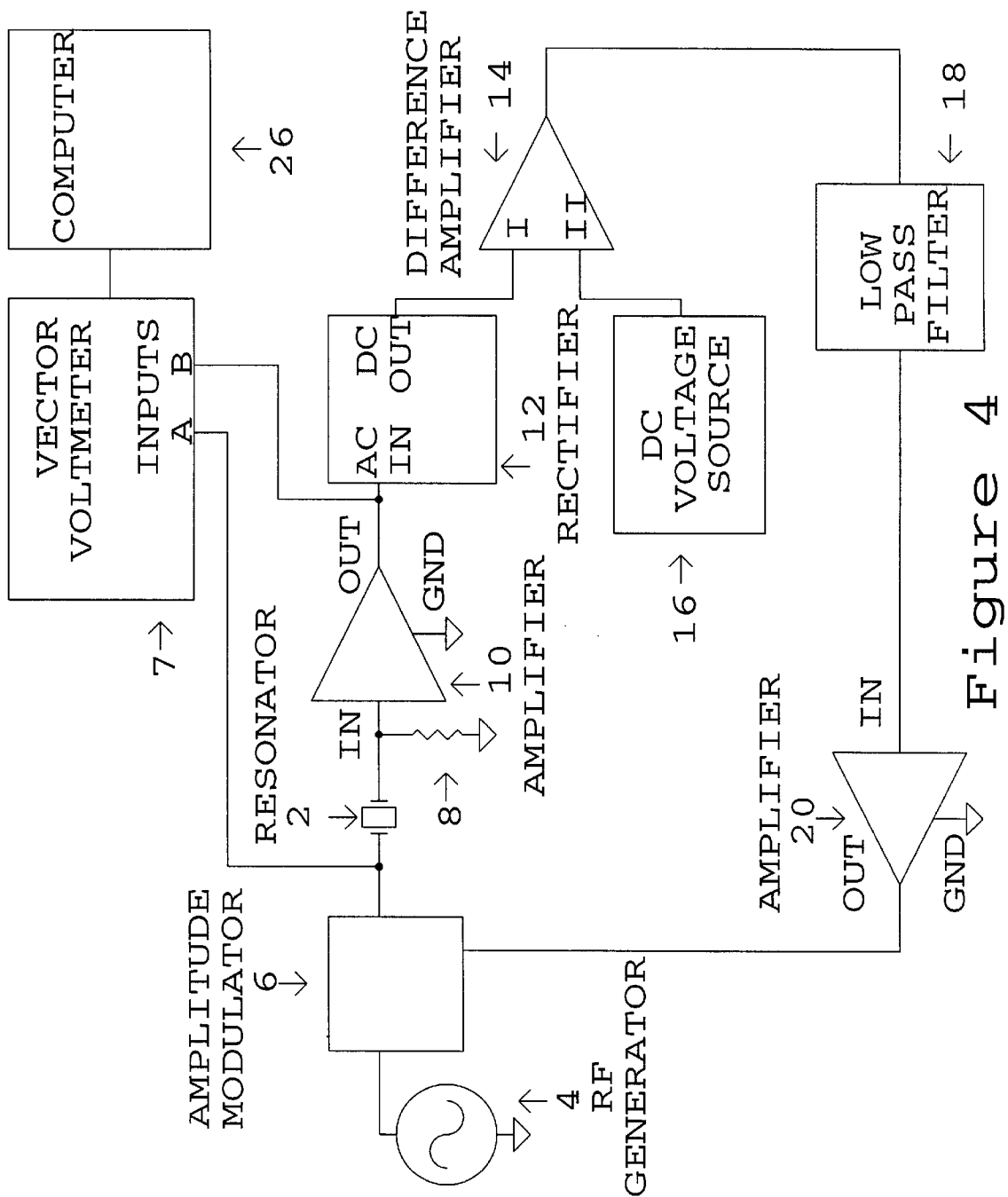
FIG. 4 shows an example of an analog circuit for implementing the invention in a transmission measurement.

FIG. 4 shows an example of an analog circuit for implementing the method by means of negative feedback in a transmission measurement. One part of the circuit includes all the elements of the circuit of FIG. 2: a resonator 2, RF generator 4, vector voltmeter 7, resistor 8, and amplifier 10. The remaining part includes a computer 26 and a feedback loop in which the output of amplifier 10 is connected to input B of vector voltmeter 7 and to the input of a rectifier 12. The rectifier output is connected to an input terminal I of a difference amplifier 14. A second input terminal II of the difference amplifier is connected to a programmable DC voltage source 16. The output of the difference amplifier is connected to a low-pass filter 18 whose output is connected via an amplifier 20 to the control input of an amplitude modulator 6.

The circuit functions as follows: An RF voltage of a frequency near resonance is applied from generator 4. It produces a voltage across resistor 8 that is proportional to the resonator current. That voltage is amplified in amplifier 10 and rectified in rectifier 12, producing DC with AC ripple. Amplifier 14 has an output proportional to the difference between the rectified voltage and the voltage from the programmable voltage source 16. The programmable voltage can be set to produce the desired steady-state resonator current Iss.

The difference voltage is amplified, then low-pass filtered to reduce the AC ripple, then again amplified, and then applied to the modulator control line.

When a voltage of a frequency near resonance is first applied, the resonator current and therefore the input voltage of amplifier 10 and the voltage at terminal I of the difference amplifier start at near-zero value. The voltage at terminal II then produces a maximum difference-amplifier output that is applied via circuits 18 and 20 to the control input of modulator 6. This maximizes the modulator output and the voltage applied to the resonator. However, as the resonator current increases, the voltage to input terminal I of the difference amplifier rises, thereby gradually decreasing the difference-amplifier output voltage. This process continues around the feedback loop until the resonator current reaches and stabilizes at its steady-state value Iss. At that time, the vector voltmeter measures the amplitude of each input and the phase of the B input relative to the A input. The results are stored in computer 26. Then at least two more measurements are made, one at another frequency near (or at) resonance, and one at a frequency far removed from resonance. The content of line 16, thereby dropping line 16 results are then used to compute the resonator parameters.

Figure 5:
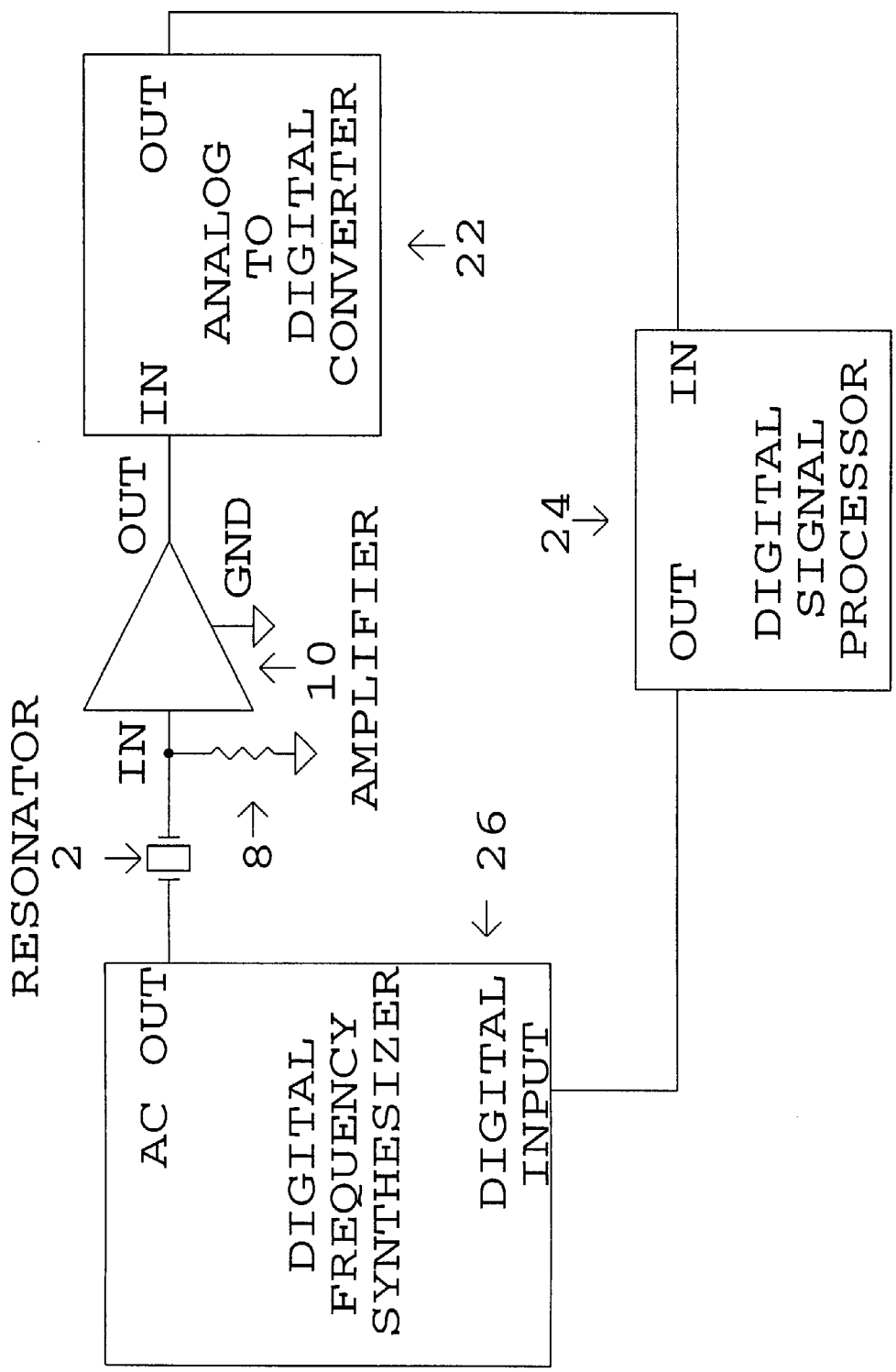
FIG. 5 shows an example of a digital circuit for implementing the invention in a transmission measurement.
Figure 6:
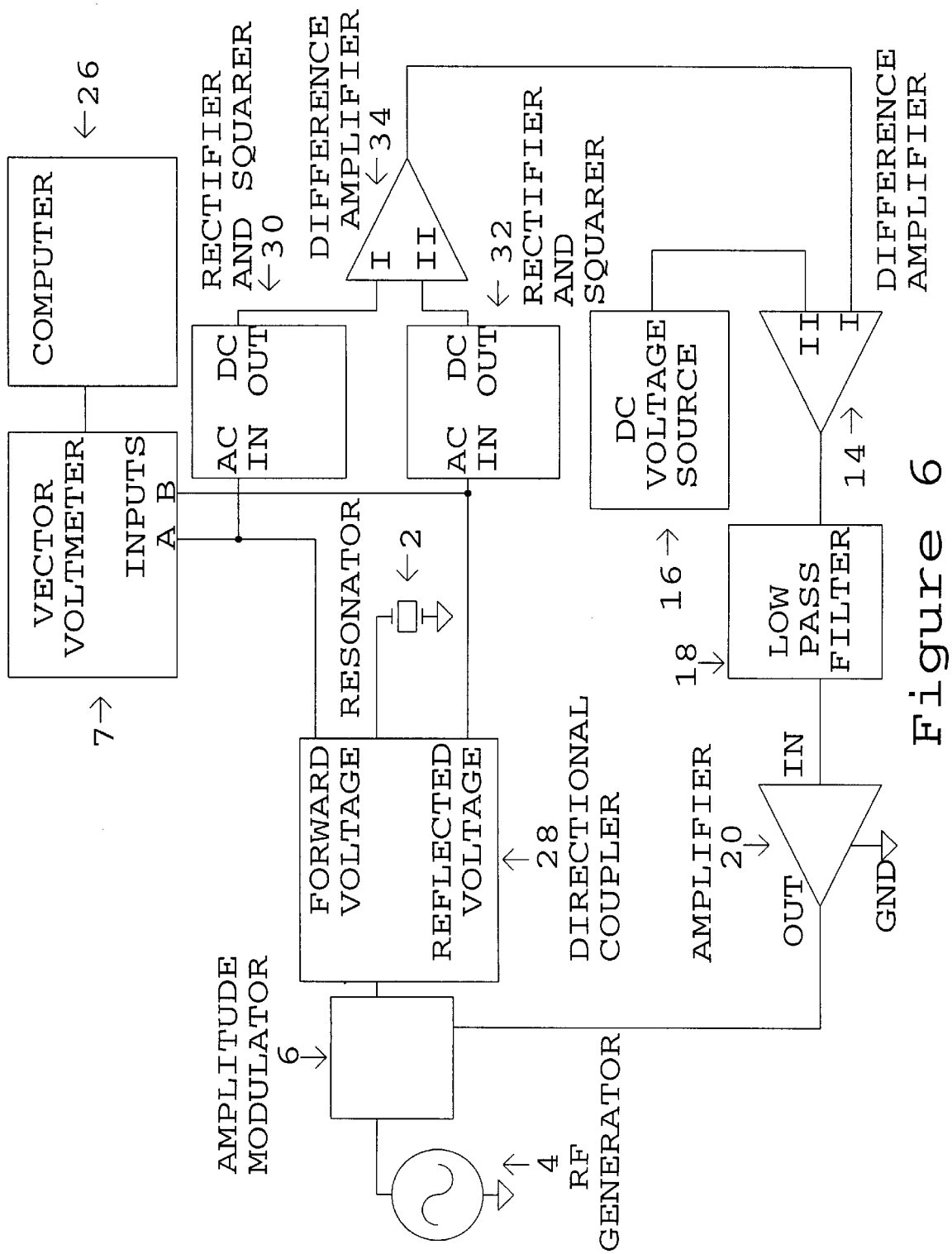
FIG. 6 shows an example of an analog circuit for implementing the invention in a reflection measurement.

The method according to the invention can also be implemented using digital circuitry, an example of which is shown in FIG. 5. In this approach, the RF output voltage from a digital frequency synthesizer 26 is applied to a resonator 2 whose output is connected to the input of an amplifier 10, in shunt with a resistor 8. The output of amplifier 10 is digitized by an analog to digital converter 22 and sent to a digital signal processor 24. Here the amplitude of the amplifier's output voltage is compared to a pre-setable voltage that corresponds to the desired steady-state current through resonator 2. The amplitude difference is used to program the amplitude of the RF output voltage of synthesizer 26. For parameter evaluation, measurements are made at at least two different frequencies near resonance, which can be set on the synthesizer. Further, the method according to the invention can also be implemented in a reflection-measurement circuit. FIG. 6 shows an example, using negative feedback and analog circuit components. The circuit is similar to that of FIG. 4, with these exceptions: a directional coupler 28 is inserted between the amplitude modulator 6 and the crystal 2. The directional coupler has two AC outputs which are proportional to the forward voltage applied to the crystal and the reflected voltage returned from the crystal, respectively. The power dissipated in the crystal is proportional to the forward voltage squared minus the reflected voltage squared. Circuits 30 and 32 each provide a DC output voltage which is proportional to the square of the amplitude of the AC input voltage. An example of such a circuit is found in the 1994 ARRL Handbook pages 34–10 through 34–15. A difference amplifier 34 subtracts the two DC voltages to give a DC voltage which is proportional to the power dissipated in the crystal. The rest of the components of FIG. 6 perform the same functions as in FIG. 4.

Also, the method according to the invention can be implemented for both transmission and reflection measurement by a combination of analog and digital circuits.

What is claimed is:

1. Method for measuring electrical parameters of piezoelectric resonators at a predetermined constant voltage level, based on
   1) initially applying a voltage larger than the predetermined voltage, and of a first frequency near resonance, to the resonator,
   2) reducing the voltage during an initial transient phase to the predetermined value, using negative feedback,
   3) after the transient phase, holding the voltage to the predetermined constant voltage, 4) measuring the resonator's electrical response to that voltage, 5) making at least one more measurement at a different frequency near resonance, 6) repeating steps 2),3),4), 7) computing the electrical parameters from the measurement results.

2. Method according to claim 1, wherein the resonator's electrical response is measured in a transmission measurement.

3. Method according to claim 1, wherein the resonator's electrical response is measured in a reflection measurement.

4. Apparatus for measuring the electrical parameters of piezoelectric resonators at a predetermined constant voltage level, comprising a variable-frequency voltage source, connectable to the resonator, and means for initially applying a voltage larger than the predetermined voltage to the resonator, then reducing the voltage during an initial transient phase to the predetermined value by means of negative feedback, after the transient phase, holding the voltage to the constant predetermined value, and measuring the resonator response at a frequency near resonance, making at least one more measurement at a different frequency near resonance, computing the electrical parameters from the measurement results.

5. Apparatus according to claim 4, wherein the resonator impedance is measured in a transmission measurement.

6. Apparatus according to claim 4, wherein the resonator impedance is measured in a reflection measurement.

* * * * *